(12) United States Patent
Shiratori et al.

(10) Patent No.: US 7,301,278 B2
(45) Date of Patent: Nov. 27, 2007

(54) ORGANIC EL ELEMENT AND METHOD OF FORMING THE SAME

(75) Inventors: Masahiro Shiratori, Yamagata (JP); Soh Fujimura, Yamagata (JP); Yasuhiro Saso, Yamagata (JP); Yoshinori Fukuda, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 291 days.

(21) Appl. No.: 11/012,237

(22) Filed: Dec. 16, 2004

(65) Prior Publication Data
US 2005/0134174 A1    Jun. 23, 2005

(30) Foreign Application Priority Data
Dec. 19, 2003    (JP)    ............. P2003-423072

(51) Int. Cl.
 H05B 33/00    (2006.01)
(52) U.S. Cl. ............. 313/506; 313/504; 445/23
(58) Field of Classification Search ............. 313/504, 313/506; 428/917; 315/169.3; 445/23
See application file for complete search history.

(56) References Cited

U.S. PATENT DOCUMENTS 5,917,280 A * 6/1999 Burrows et al. ............. 313/506
6,936,961 B2 * 8/2005 Liao et al. ............. 313/506

FOREIGN PATENT DOCUMENTS

| JP | 2003-45676 A | 2/2003 |
| JP | 2003-272860 A | 9/2003 |

OTHER PUBLICATIONS

Dai 49 kai oyobutsurigaku kanren rengo koenkai yokoshu, Mar. 27, 2002; p. 1308.
Dai 63 kai oyobutsurigakkai gakujutsu koenkai yokoshu, Sep. 24, 2002; p. 1165.

* cited by examiner

*Primary Examiner*—Ashok Patel
(74) *Attorney, Agent, or Firm*—Sughrue Mion Pllc.

(57) ABSTRACT

An organic EL element includes a plurality of light-emitting units which exhibit organic EL luminescence and at least two different luminous colors and are connected in series; and a light-emitting surface formed by overlapping partly or wholly light-emitting surfaces of the light-emitting units. The plurality of light-emitting units includes light-emitting units which exhibit one color and are formed in multiple stages. A desired mixed color is obtained from the light-emitting surface by combining the different luminous colors.

12 Claims, 6 Drawing Sheets

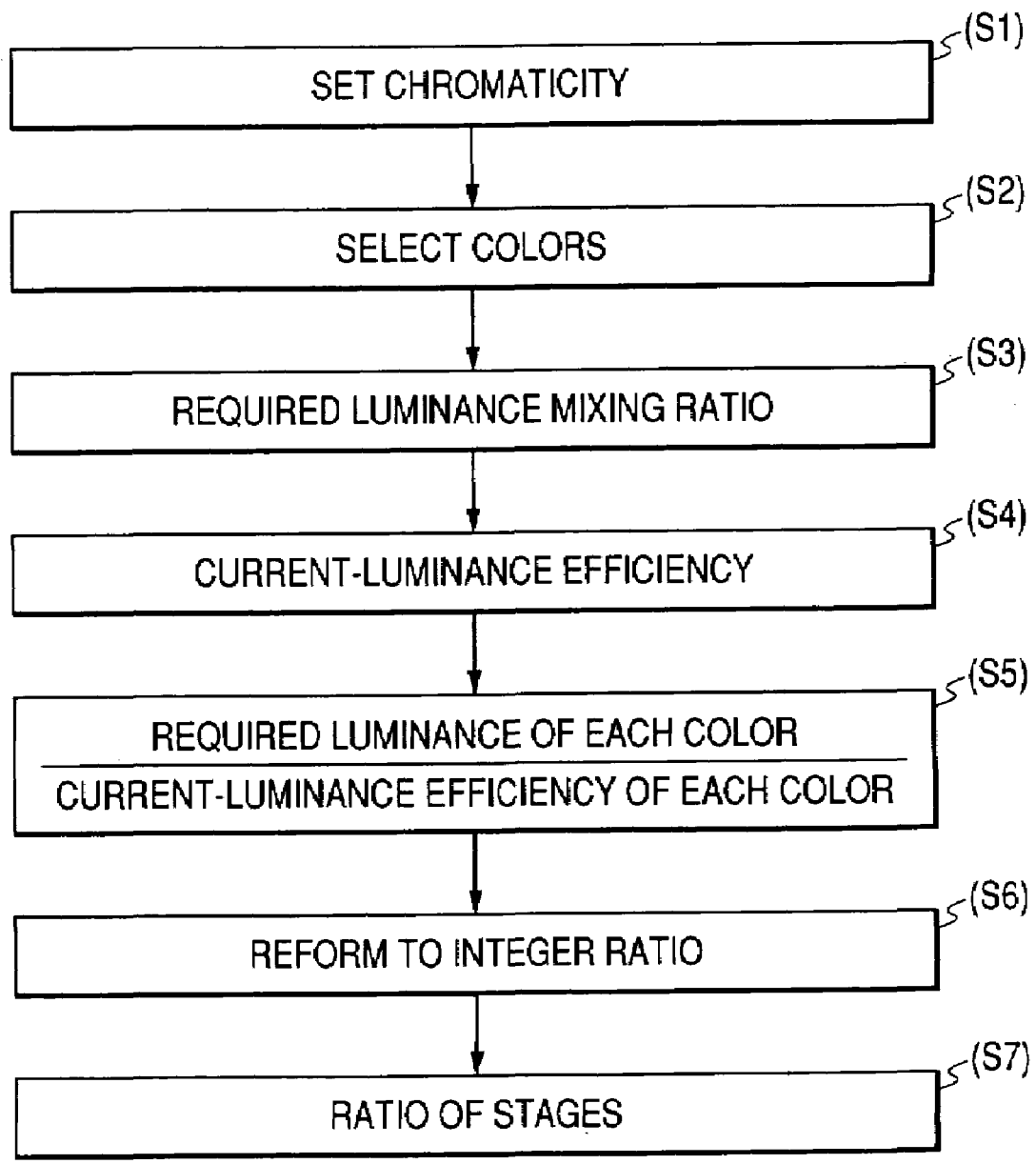

ORGANIC EL ELEMENT AND METHOD OF FORMING THE SAME

BACKGROUND OF THE INVENTION

1. Field of the Invention

The present invention relates to an organic EL element, and also to a method of forming it.

2. Description of the Related Art

An organic EL (Electroluminescence) element has a basic structure in which a lower electrode is formed on a substrate, an organic material layer including a luminescent layer is formed in a single- or multi-layer form on the lower electrode, and an upper electrode is formed on the organic material layer, whereby the organic material layer is interposed between the pair of electrodes. One of the upper and lower electrodes is used as an anode, and the other electrode as a cathode. When a voltage is applied between the electrodes, electrons which are injected and transported from the cathode into the organic material layer recombine with holes which are injected and transported from the anode, thereby causing luminescence. Recently, such an organic EL element receives attention as a thin luminescence element which can provide surface luminescence, and which constitutes a light source for various purposes or a display unit of a self-luminous thin display device.

JP-A-2003-45676 proposes an organic EL element which is an improvement of an organic EL element having the above-described basic structure, and in which bright luminescence can be obtained and the life can be prolonged. FIG. 1 is a diagram illustrating the conventional art. In the organic EL element of the conventional art, a plurality of light-emitting units (3-1, 3-2, . . . , 3-n) are disposed on a substrate 1 and between an anode 2 and a cathode 5 which are opposed to each other, and the light-emitting units are separated from one another by layers (4-1, 4-2, . . . , 4-(n-1)) respectively forming a single equipotential plane.

In the organic EL element, each of the layers (4-1, 4-2, . . . , 4-(n-1)) which separate the light-emitting units (3-1, 3-2, . . . , 3-n) from one another has a function of generating holes for the light-emitting unit which is adjacent on the side of the cathode, and electrons for that which is adjacent on the side of the anode. The above-described basic structure is formed for each of the light-emitting units. The resulting structures are connected in series.

In the organic EL element, the light-emitting units exhibiting organic EL luminescence are connected in series, and the driving voltage is equal to the total sum of potentials consumed by the light-emitting units. A plurality of luminescences produced respectively in the light-emitting units can be combined, and the resulting composite light can be emitted. Therefore, high luminance can be obtained in accordance with the number of the light-emitting units.

Usually, the luminance of an organic EL element is substantially proportional to the current density. In order to obtain high luminance, therefore, a high current density is inevitably required. When the current density is set to be high, there arises a disadvantage that the life of the element is shortened. By contrast, in the organic EL element disclosed in JP-A-2003-45676, high luminance can be obtained by increasing the number of light-emitting units, and, even when the unit number is increased, the current density in each of the light-emitting units is not changed. Therefore, it is possible to realize high luminance without sacrificing the life of the element.

The method in which plural light-emitting units are connected in series via conductive layers having a function of generating charges, and luminescences produced respectively in the light-emitting units are combined together to obtain composite light is reported also in Dai 49 kai oyobutsurigaku kanren rengo koenkai yokoshu p. 1308 (27p-YL-3) in addition to JP-A-2003-45676. A technique in which plural light-emitting units produces luminescences of different colors, and the luminescences are superimposed to obtain a synthetic color is disclosed in Dai 63 kai oyobutsurigakkai gakujutsu koenkai yokoshu p. 1165 (27a-ZL-12).

As described above, in an organic EL element in which plural light-emitting units exhibiting organic EL luminescence are connected in series, the same current flows through the series-connected light-emitting units, and hence the current density cannot be adjusted for each of the light-emitting units. Therefore, the chromaticity of the mixed color output from the whole organic EL element is automatically determined by the luminance efficiency (current-luminance efficiency) of each of the light-emitting units with respect to the density of the common current flowing through all of the light-emitting units.

In other words, in such an organic EL element, even when the luminous color which is obtained as a mixed color of the light-emitting units is to be set to a desired chromaticity, it is impossible to adjust the luminance of each color for each of the light-emitting units, and hence the chromaticity of the mixed color is determined by the current-luminance efficiency of a selected luminescent material, thereby causing a problem in that the obtained mixed color fails to have the desired chromaticity.

A case where such an organic EL element is used as a white light source due to mixture of three colors of R (Red), G (Green), and B (Blue) will be considered. Organic EL luminescent materials have different current-luminance efficiencies for the colors of R (Red), G (Green), and B (Blue), and the luminance mixing ratio of RGB (R:G:B=3:6:1) for obtaining white by color mixture cannot be obtained only by selecting a luminescent material. Therefore, there arises a problem in that white cannot be obtained by color mixture of light-emitting units.

Luminescent materials which are useful in light-emitting units include those which exhibit luminescence (fluorescence) when the state is returned from the singlet excited state to the ground state, and those which exhibit luminescence (phosphorescence) when the state is returned from the triplet excited state to the ground state. Usually, the quantum efficiency of fluorescence is $\frac{1}{3}$ to $\frac{1}{4}$ of that of phosphorescence. Consequently, there is a problem in that, when color mixture of RGB is obtained by using both kinds of luminescences, the obtained color is hued white.

SUMMARY OF THE INVENTION

The present invention has been made in view of the above circumstances. An object of the invention is such as that, in an organic EL element in which a plurality of light-emitting units exhibiting organic EL luminescence are connected in series, a color obtained by mixture of luminous colors of the light-emitting units is set to a desired chromaticity, and that white is obtained as a result of the color mixture.

According to a first aspect of the invention, an organic EL element includes a plurality of light-emitting units which exhibit organic EL luminescence and at least two different luminous colors and are connected in series; and a light-emitting surface formed by overlapping partly or wholly light-emitting surfaces of the light-emitting units. The plurality of light-emitting units comprise light-emitting units which exhibit one color and are formed in multiple stages, and a desired mixed color is obtained from the light-emitting surface by combining the different luminous colors.

According to a second aspect of the invention, a method of forming an organic EL element including a plurality of light-emitting units exhibiting organic EL luminescence and at least two different luminous colors, comprises: connecting the plurality of light-emitting units in series; and overlapping partly or wholly light-emitting surfaces of the light-emitting units to form a light-emitting surface of the organic EL element. The plurality of light-emitting units comprise light-emitting units which exhibit one color and are formed in multiple stages, and a desired mixed color is obtained from the light-emitting surface of the organic EL element by combining the different luminous colors.

BRIEF DESCRIPTION OF THE DRAWINGS

FIG. 4 is a chart illustrating a procedure for determining the stage number of light-emitting units of each color in the organic EL element of the embodiment of the invention;

DETAILED DESCRIPTION OF THE PREFFERED EMBODIMENTS

Hereinafter, an embodiment of the invention will be described with reference to the accompanying drawings. FIGS. 2A to 2C and 3A to 3C are diagrams illustrating an organic EL element of an embodiment of the invention, and a method of forming the element.

Figure 1:
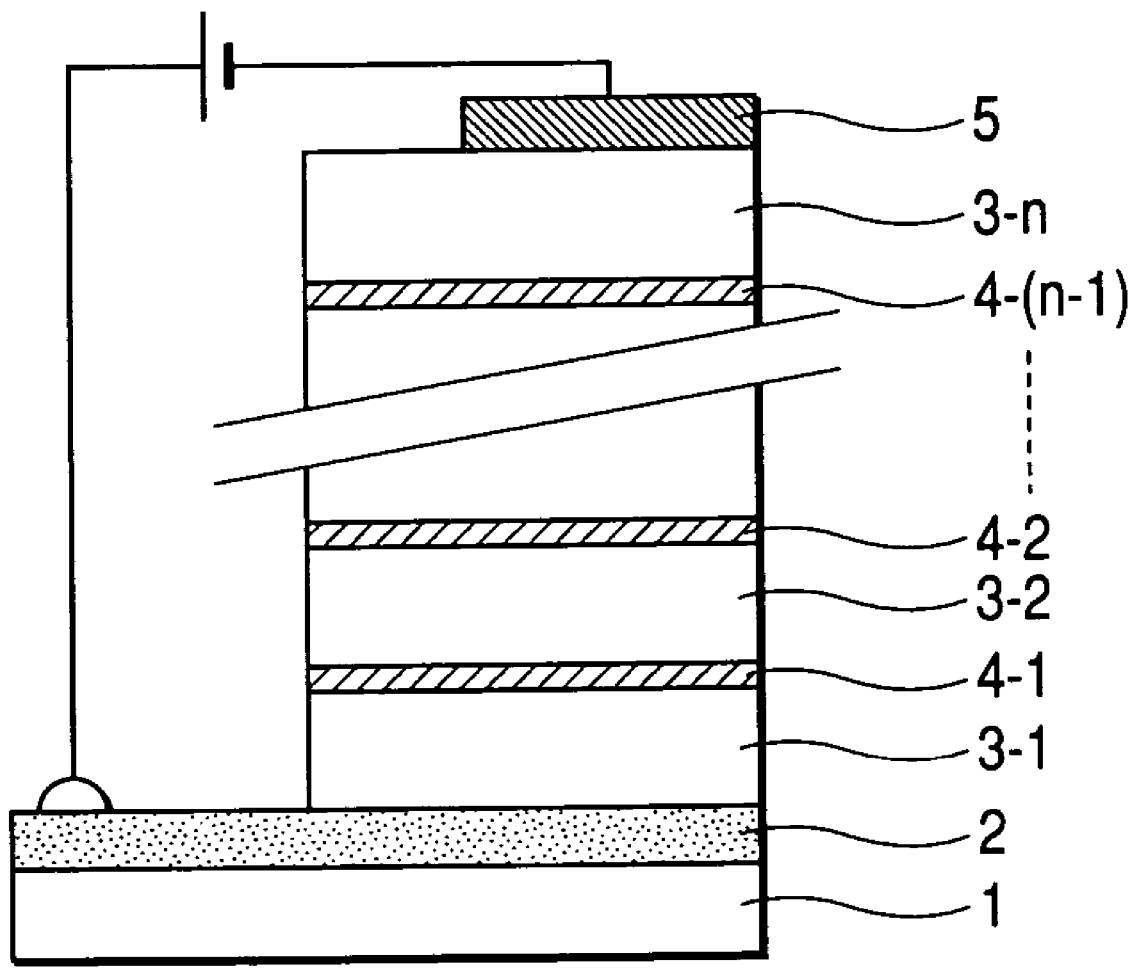
FIG. 1 is a diagram illustrating the conventional art.
Figure 2A:
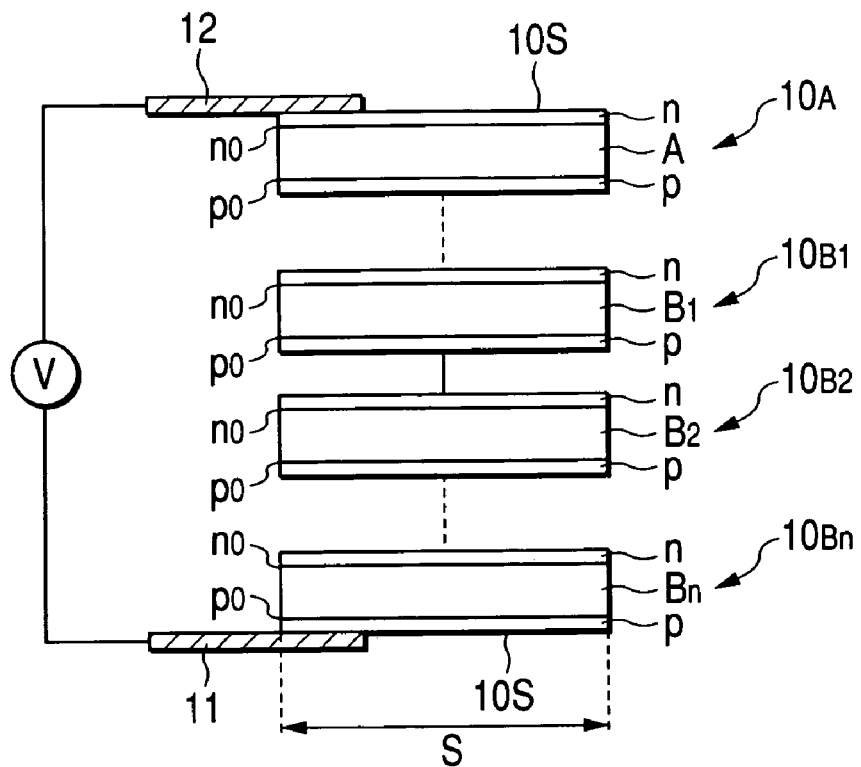
FIG. 2A to 2c are diagrams illustrating an organic EL element of an embodiment of the invention.

The organic EL element of the embodiment of the invention is based on the premise that, as shown in FIG. 2A, a plurality of light-emitting units $10_A, \ldots, 10_{B1}, 10_{B2}, \ldots, 10_{Bn}$ exhibiting organic EL luminescence are connected in series, and light-emitting surfaces of the light-emitting units $10_A, \ldots, 10_{B1}, 10_{B2}, \ldots, 10_{Bn}$ are partly or wholly overlapped with one another to form light-emitting surfaces 10S.

The light-emitting units $10_A, \ldots, 10_{B1}, 10_{B2}, \ldots, 10_{Bn}$ comprise organic luminescent function layers A, B1, B2, ..., Bn, respectively. The organic luminescent function layers are interposed between conductive layers p, n, respectively, so that cathode function interfaces $n_0$ are formed in interfaces between the organic luminescent function layers A, ..., B1, B2, ..., Bn and the conductive layers n, and anode function interfaces $p_0$ are formed in interfaces between the organic luminescent function layers A, ..., B1, B2, ..., Bn and the conductive layers p. When a voltage V is applied to the series-connected light-emitting units $10_A, \ldots, 10_{B1}, 10_{B2}, \ldots, 10_{Bn}$ via wiring electrodes 11, 12, electrons are injected from the cathode function interfaces $n_0$ into the organic luminescent function layers A, ..., B1, B2, ..., Bn, and holes are injected from the anode function interfaces $p_0$ into the organic luminescent function layers. The electrons and the holes are recombined with one another to produce organic EL luminescence from the light-emitting units $10_A, \ldots, 10_{B1}, 10_{Bn}$. As a result of the recombination, a common current flows through the light-emitting units $10_A, \ldots, 10_{B1}, 10_{B2}, \ldots, 10_{Bn}$.

The light-emitting surface of each of the light-emitting units $10_A, \ldots, 10_{B1}, 10_{B2}, \ldots, 10_{Bn}$ is formed on the outside of one or both of the respective conductive layers n, p. The light-emitting surfaces are partly or wholly overlapped with one another to form the light-emitting surfaces 10S of the organic EL element, on one or both of the upper and lower outermost faces. As a result, the light-emitting region S of the light-emitting surfaces 10S is the overlapping portion of the light-emitting surfaces of the light-emitting units $10_A, \ldots, 10_{B1}, 10_{B2}, \ldots, 10_{Bn}$. Therefore, light-emitting units which are stacked on the side of light emission are formed so as to be transparent or translucent, and the light-emitting unit which is placed in the outermost side opposite to the light emission side may be opaque. In the case where light is to be emitted from both the upper and lower sides, all of the light-emitting units are formed so as to be transparent.

The light-emitting units $10_A, \ldots, 10_{B1}, 10_{B2}, \ldots, 10_{Bn}$ of the organic EL element include light-emitting units exhibiting at least two different luminous colors. Although, in the embodiment, the light-emitting units exhibit two colors of colors A and B, the invention is not restricted to this, and the light-emitting units may exhibit three or more colors. The light-emitting units $10_{B1}, 10_{B2}, \ldots, 10_{Bn}$ which exhibit at least one color are formed in multiple stages. In the embodiment, only the light-emitting units of color B are formed in multiple stages. Alternatively, light-emitting units of plural colors may be formed in multiple stages. A desired mixed color which is obtained by combining the different luminous colors produced by the light-emitting units $10_A, \ldots, 10_{B1}, 10_{B2}, \ldots, 10_{Bn}$ is emitted from the light-emitting surfaces 10S.

Figure 2B:
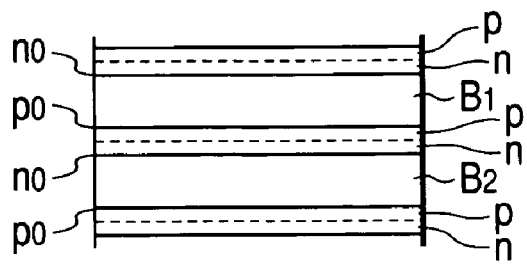
Figure 2C:
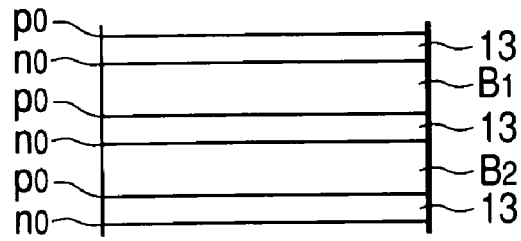

The light-emitting units $10_A, \ldots, 10_{B1}, 10_{B2}, \ldots, 10_{Bn}$ may be arranged in any of the forms such as that, as shown in FIG. 2A, the light-emitting units are formed, for example, on different substrates to be separated from one another, that, as shown in FIG. 2B, the light-emitting units are stacked and the conductive layers p and the conductive layers n are closely contacted with each other, and that, as shown in FIG. 2C, the light-emitting units are stacked, each pair of the conductive layers p and n is formed by a single conductive layer 13, and anode and cathode function interfaces $p_0$ and $n_0$ are formed on the upper and lower interfaces of the conductive layer 13, respectively. In summary, any form can be employed as far as the light-emitting units are connected in series.

Figure 3A:
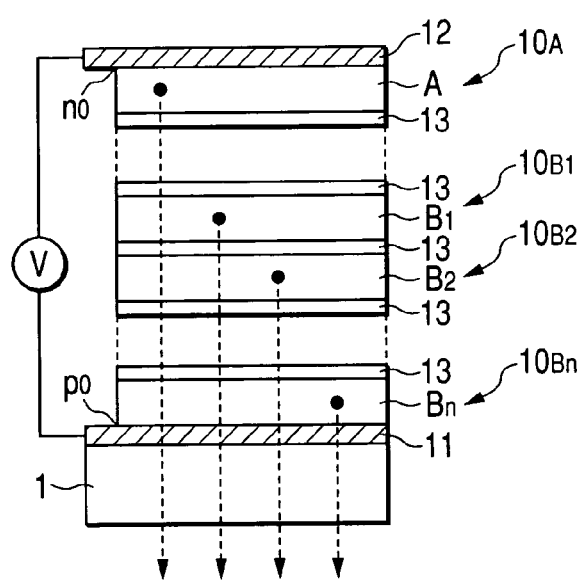
FIG. 3A to 3C are diagrams illustrating the organic EL element of the embodiment of the invention.
Figure 3B:
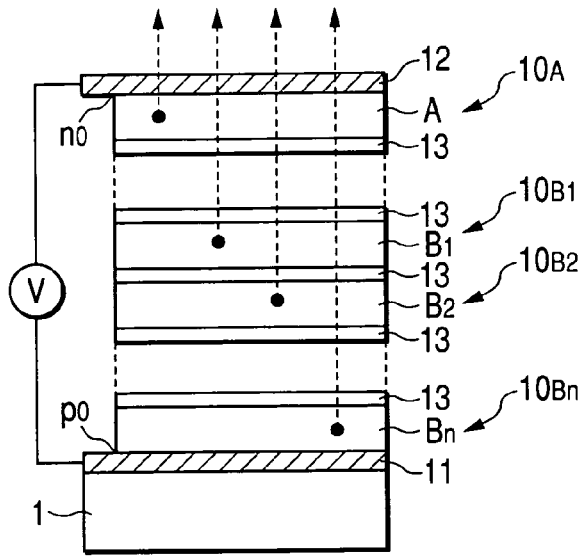
Figure 3C:
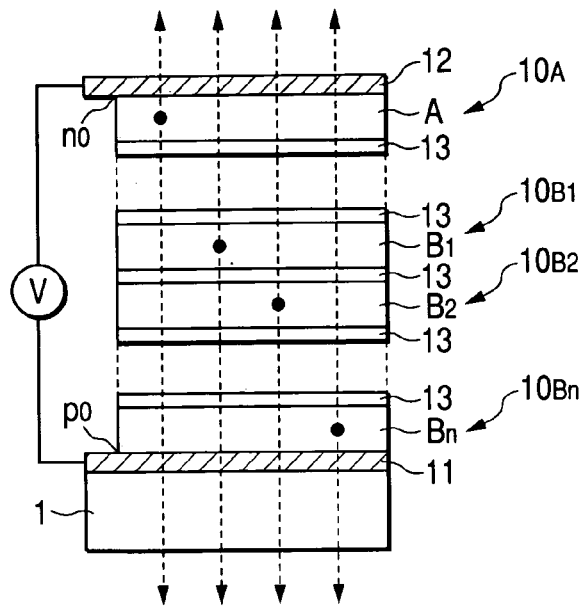

More specifically, the organic EL element may be configured in the manner shown in FIG. 3A to 3C. The wiring electrode 11 (lower electrode) is formed on the substrate 1 so as to function also as a conductive layer for forming the anode function interface $p_0$. The light-emitting units $10_{Bn}, \ldots, 10_{B2}, 10_{B1}, \ldots, 10_A$ are sequentially stacked on the electrode. The wiring electrode 12 is stacked on the uppermost light-emitting unit so as to function as a conductive layer for forming the cathode function interface $n_0$.

In the thus configured organic EL element, the light-emitting units $10_A, \ldots, 10_{B1}, 10_{B2}, \ldots, 10_{Bn}$ produce plural luminescences, and the driving voltage V is equal to the total sum of potentials consumed by the light-emitting units. However, composite light which is obtained by combining the luminescences produced by the light-emitting units can be emitted, and hence high luminance can be obtained in accordance with the layer number of the light-emitting units.

The common current flowing through the light-emitting units is irrespective of the layer number of the light-emitting units, and hence high luminance can be realized without sacrificing the life of the element.

FIGS. 3A to 3C show manners of emitting light from the organic EL element. The example of FIG. 3A shows a type (bottom emission type) in which the wiring electrode 12 or the uppermost light-emitting unit $10_A$ is opaque, and the other light-emitting units, the wiring electrode 11, and the substrate 1 are transparent so that light is emitted from the side of the substrate 1. The example of FIG. 3B shows a type (top emission type) in which one or all of the substrate 1, the wiring electrode 11, and the lowermost light-emitting unit $10_{Bn}$ are opaque, and the other light-emitting units and the wiring electrode 12 are transparent so that light is emitted from the upper face. The example of FIG. 3C shows a type (TOLED type) in which the wiring electrodes 11 and 12, all of the light-emitting units, and the substrate 1 are transparent and light is emitted from the upper and lower faces.

In such an organic EL element, the luminance of light emitted from the light-emitting units of color A, and that of the light emitted from the light-emitting units of color B depend on the common current density, and the luminancees of the colors cannot be independently adjusted for each of the light-emitting units. In an organic EL element configured by one layer of the light-emitting unit of color A and one layer of the light-emitting unit of color B, therefore, the chromaticity of the mixed color is determined by the current-luminance efficiencies of the light-emitting units, and hence the mixed color obtained from the light-emitting surfaces of the organic EL element cannot be set to a desired chromaticity.

In the organic EL element of the embodiment of the invention, by at least forming the light-emitting units exhibiting one color in multiple stages, and the number of stages of the light-emitting units is adjusted, whereby the mixed color to be emitted from the light-emitting surfaces 10S of the organic EL element is enabled to be set to a desired chromaticity.

Specifically, when a luminous color of a certain chromaticity is to be obtained by mixing plural luminous colors (for example, colors A and B), the luminous colors must be combined with each other in accordance with the required luminance mixing ratio (color A: color B=a:b) of the colors. In practice, however, the luminance ratio of the colors is determined in accordance with the current-luminance efficiencies of the light-emitting units, and hence the color cannot be attained even when a desired chromaticity is to be obtained. With respect to a color in which the luminance must be enhanced in terms of the required luminance mixing ratio, light-emitting units of the color are formed in multiple stages, whereby the luminance is compensated so as to approximate the required luminance mixing ratio for obtaining the desired chromaticity.

The chromaticity setting in the organic EL element of the embodiment of the invention will be described with using a more general example.

A certain color is indicated as A, and another color as B. A process of mixing colors A and B at a luminance ratio of a:b to obtain further color C is expressed by (formula 0) below.

$$C = \frac{a}{a+b} \cdot A + \frac{b}{a+b} \cdot B \quad \text{(formula 0)}$$

In accordance with the notation, a synthetic color $C_0$ which is obtained by mixing n kinds of luminous colors (where n is a natural number) can be expressed by (formula 1) below in which a k-th luminous color (where k is a natural number) is $C_k$, the current-luminance efficiency of a single light-emitting unit exhibiting the luminous color is $\phi_k$, and the luminance ratio of luminous color $C_k$ to the total is $a_k$.

$$c_0 = \sum_{k=1}^{n} a_k C_k, \quad \sum_{k=1}^{n} a_k = 1 \quad \text{(formula 1)}$$

For example, a case where three colors of $C_1$=R (Red)=(0.67, 0.33), $C_2$=G (Green)=(0.21, 0.71), and $C_3$=B (Blue)=(0.14, 0.08) on the CIE chromaticity diagram are mixed will be considered. When $a_1$=0.299, $a_2$=0.586, and $a_3$=0.115, it is possible to obtain $C_0$=W (NTSC White)=(0.310, 0.316) (namely, the required luminance mixing ratio for obtaining white by the above-mentioned mixture of RGB is $a_1$: $a_2$:$a_3$).

Conversely, when it is possible to change $a_k$, the chromaticity of the synthetic color can be freely set in the range where color mixture of the n kinds of luminous colors can be obtained. In the organic EL element of the embodiment of the invention in which the light-emitting units $10_A, \ldots, 10_{B1}, 10_{B2}, \ldots, 10_{Bn}$ are connected in series, however, $a_k$ cannot be changed by independently adjusting the luminance of each of the light-emitting units. Therefore, the embodiment is configured so that $a_k$ can be changed by adjusting the number of stages of light-emitting units of a certain luminous color.

When the number of stages of light-emitting units exhibiting a k-th luminous color is $m_k$ (where $m_k$ is a natural number), the resulting synthetic color $C_0$ is expressed by:

$$c_0 = \left\{ \sum_{k=1}^{n} m_k \phi_k C_k \right\} / \left\{ \sum_{k=1}^{n} m_k \phi_k \right\} \quad \text{(formula 2)}$$

Therefore, the synthetic color $C_0$ can be discretely changed by selecting $m_k$.

In a method of forming the organic EL element according to the embodiment of the invention, the manner how the number of stages of light-emitting units for each color (the number of light-emitting units of the same color) is set becomes an issue. The stage number is set so that the luminous color of the organic EL element which is obtained as mixture of the luminous colors of the light-emitting units becomes close to the desired chromaticity. The stage number is obtained in accordance with the current-luminance efficiency of each of the light-emitting units, and the luminance mixing ratio of the colors (required luminance mixing ratio) required for obtaining the desired chromaticity by mixture of the luminous colors of the light-emitting units.

The procedure for obtaining the stage number of light-emitting units of a certain color will be described more specifically with reference to FIG. 4 (in the following description, it is assumed that the selected colors of the light-emitting units are three or more colors (color A, color B, color C, . . . )).

First, a chromaticity which is to be obtained in the organic EL element is set in accordance with the usage. When the element is to be used as a white light illumination source, for example, the chromaticity of white (NTSC white) is set (S1). Next, plural colors which are required for obtaining the preset chromaticity by color mixture are selected, and materials which emit the colors are used as luminescent materials of the light-emitting units. In the case where white (NTSC white) is set as a preset chromaticity, for example, three colors of red, green, and blue can be selected (S2). Alternatively, two colors of, for example, light blue and orange may be selected, or four or more colors may be selected. The required luminance mixing ratio for obtaining the desired chromaticity by mixture of the colors is obtained from the chromaticities of the colors. Namely, the ratio of required chromaticities of the selected colors of the light-emitting units is obtained in order to mix the colors to obtain the desired chromaticity (S3).

Hereinafter, the case where, in order to obtain the preset chromaticity, different colors A, B, C, . . . are selected, light-emitting units of the selected colors are used, and the required luminance mixing ratio is expressed by (formula 3) below will be considered.

[required luminance of A]:[required luminance of B]:[required luminance of C]: . . . =a:b:c: . . .   (formula 3)

The current-luminance efficiency (cd/A) of each of the light-emitting units is obtained (S4), [required luminance of each color]/[current-luminance efficiency of each color] is obtained (S5), and the result is expressed as a ratio for each color and then reformed to an integer ratio (an integer ratio which is closest to the ratio is obtained) (S6). As a result, the ratio of the stages of the light-emitting units of the colors is obtained (S7).

Specifically, in the case where, with respect to [required luminance]/[current-luminance efficiency], only color A is n times the other colors B and C, the stage number of the light-emitting units of color A is set to be n times the stage number of the light-emitting units of the other colors. Namely, when an integer ratio which is closest to a ratio that satisfies (formula 4) below is determined as the stage number ratio, a color which is near the preset chromaticity can be obtained as the luminous color of the organic EL element. In the same manner as described above, in order to suppress the power consumption, the total number of the light-emitting units is preferably set to be as small as possible.

[stage number of A]:[stage number of B]:[stage number of C]: . . . =n:1:1: . . .   (formula 4)

As light-emitting units in an organic EL element, light-emitting units using a luminescent material which exhibits luminescence (fluorescence) when the state is returned from the singlet excited state to the ground state, and those using a luminescent material which exhibits luminescence (phosphorescence) when the state is returned from the triplet excited state to the ground state may be mixedly used. In this case, the quantum efficiency of fluorescence is ⅓ to ¼ of that of phosphorescence, and hence the difference in above-mentioned [required luminance]/[current-luminance efficiency] is often large. The organic EL element of the embodiment of the invention is effective in the case where fluorescent light-emitting units and phosphorescent light-emitting units are mixedly used as described above, and different luminous colors of the light-emitting units are combined to obtain a mixed color of a desired chromaticity.

Specifically, in the case where at least one of the light-emitting units is a phosphorescent light-emitting unit, the phosphorescent light-emitting unit is formed in one layer, and the other or fluorescent light-emitting units are formed in multiple stages, whereby the luminance ratio of the colors can be made closer to the luminance mixing ratio required for obtaining the desired chromaticity.

Even in the case where at least one of the light-emitting units exhibits phosphorescence due to transition from the triplet excited state, or where the light-emitting units include those exhibiting phosphorescence and those exhibiting fluorescence, the luminous color of the organic EL element can be set to a desired chromaticity by employing the concept that the light-emitting units of the colors are formed in multiple stages.

According to the organic EL element of the embodiment of the invention, even when a difference exists between the current-luminance efficiencies of the light-emitting units of respective colors and the required luminance mixing ratio for obtaining white by color mixture cannot be attained by a light-emitting unit set in which one light-emitting unit is disposed for each color, the adjustment of the stage numbers of the light-emitting units enables the white region of the CIE xy chromaticity diagram (JIS Z 8110) to be realized by color mixture of the light-emitting units.

Hereinafter, the components of the organic EL element of the embodiment of the invention will be described more specifically.

a. Organic luminescent function layers

Each of the organic luminescent function layers A, . . . , B1, B2, . . . , Bn is formed by an organic compound material layer in a single- or multi-layer form. The layers may have any layer configuration. Usually, a layer configuration can be used in which a hole transporting layer, a luminescent layer, and an electron transporting layer are stacked in this sequence as advancing from the anode function interface $p_0$ to the cathode function interface $n_0$. Alternatively, plural luminescent layers, hole transporting layers, or electron transporting layers may be stacked in place of a single-layer stack. One or both of the hole transporting layer and the electron transporting layer may be omitted. Organic material layers such as a hole injecting layer, an electron injecting layer, and a carrier blocking layer may be inserted in accordance with the usage of the element. In the hole transporting layer, the luminescent layer, and the electron transporting layer, conventional useful materials (whether a polymer material or a low-molecular material) can be adequately selected and used in accordance with the luminous color.

As the luminescent material forming the luminescent layer, as described above, either of a material which exhibits luminescence (fluorescence) when the state is returned from the singlet excited state to the ground state, and that which exhibits luminescence (phosphorescence) when the state is returned from the triplet excited state to the ground state can be used. Alternatively, both a fluorescent material and a phosphorescent material may be mixedly used.

b. Conductive layers

In order to combine luminescences from the light-emitting units $10_A, \ldots, 10_{B1}, 10_{B2}, \ldots, 10_{Bn}$, the conductive layers p, n, 13 are preferably made of a transparent or translucent material. The material is requested to form the anode function interface $p_0$ or the cathode function interface $n_0$ in the interfaces with the organic luminescent function layers A, . . . , B1, B2, Bn. Conductive inorganic compounds such as ITO, IZO, and $V_2O_5$ are useful.

In the anode function interface $p_0$, the injection barrier is preferably set to be low, in order to allow holes to be effectively injected from the conductive layer into the organic luminescent function layer. Therefore, it is preferable to set the work function to be 4.0 eV or higher.

In the cathode function interface $n_0$, the injection barrier is preferably set to be low, in order to allow electrons to be effectively injected from the conductive layer into the organic luminescent function layer. Therefore, the work function is set to be 3.5 eV or lower, or preferably 3.0 eV or lower. A conductive layer material for forming the cathode function interface $n_0$ can be configured by: a metal of a low work function such as an alkali metal (Li, Na, K, Rb, Cs), an alkaline earth metal (Be, Mg, Ca, Sr, Ba), or a rear earth metal; a compound of such a metal; or an alloy containing such a metal or a compound. The metal of a low work function, a compound of such a metal, or an alloy containing such a metal or a compound may be interposed between the organic luminescent function layer and the conductive layer, or may be contained in one or both of the organic luminescent function layer and the conductive layer.

c. Wiring electrodes

In the case where the wiring electrodes 11, 12 themselves exert also a function of injecting charges, one of the electrodes is set as the cathode, and the other electrode as the anode. In this case, preferably, the anode is made of a material of a relatively high work function. As such a material, useful are a metal film of chromium (Cr), molybdenum (Mo), nickel (Ni), platinum (Pt), or the like, a transparent conductive film such as a metal oxide film of ITO, IZO, and the like. The cathode is preferably made of a material of a relatively low work function. Particularly useful are a metal of a low work function such as an alkali metal (Li, Na, K, Rb, Cs), an alkaline earth metal (Be, Mg, Ca, Sr, Ba), or a rear earth metal, a compound of such a metal, and an alloy containing such a metal or a compound. The metal of a low work function, a compound of such a metal, or an alloy containing such a metal or a compound may be interposed between the organic luminescent function layer and the conductive layer, or may be contained in one or both of the organic luminescent function layer and the conductive layer. In a configuration where both the wiring electrodes 11, 12 are made of a transparent material, a reflection film may be disposed on the electrode side opposite to the light emission side.

d. Various methods, etc.

The organic EL element of the embodiment of the invention may be used for forming a display panel of the passive matrix type, or forming a display panel of the active matrix type. In order to form a color display panel, a full-color organic EL panel or a multi-color organic EL panel can be formed by the selective application method, a method (the CF method or the CCM method) in which monochromatic luminescent function layers of white, blue, or the like are combined with a color converting layer formed by a color filter or a fluorescent material, or other methods. The organic EL element of the embodiment of the invention may be formed as the bottom emission type in which light is emitted from the side of the substrate 1, or the top emission type in which light is emitted from the side opposite to the substrate 1.

The organic EL element and the method of forming it according to the embodiment of the invention are configured as described above, and hence attain the following effects.

A plurality of luminescences produced respectively in the light-emitting units can be combined, and the resulting synthetic light can be emitted. Therefore, high luminance can be obtained in accordance with the number of the light-emitting units. The obtained high luminance is not accompanied by an increased density of the current flowing through the light-emitting units. Therefore, it is possible to realize high luminance without sacrificing the life of the element. Furthermore, by at least forming light-emitting units of one color in multiple stages, and hence a luminous color of a desired chromaticity can be obtained by mixing luminous colors of the light-emitting units. In accordance with the selected colors of the light-emitting units and the number of stages of the light-emitting units, it is possible to obtain white from color mixture of the luminous colors of the light-emitting units.

Figure 5A:
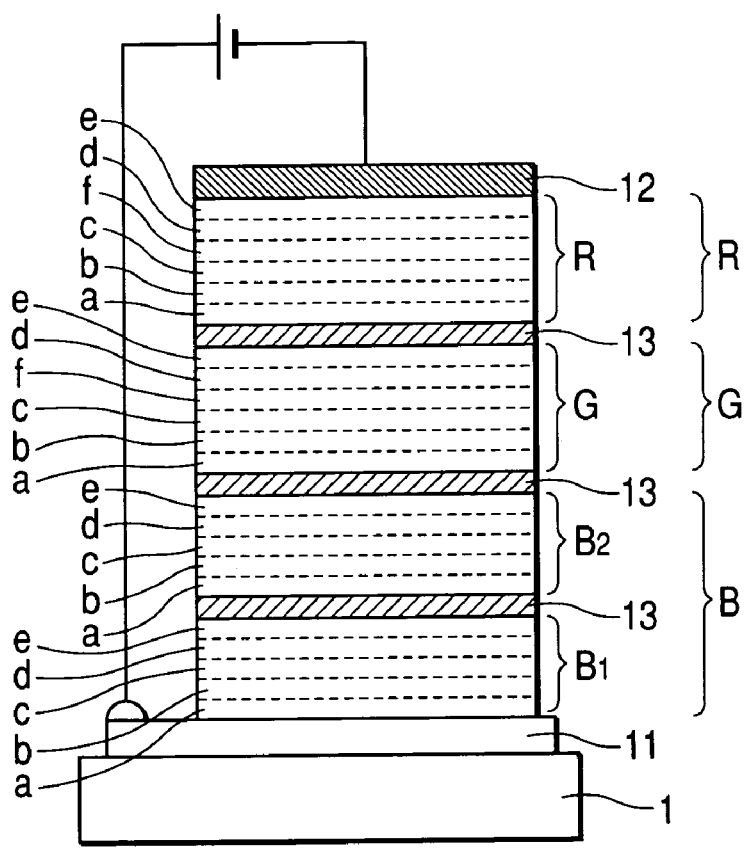
FIG. 5A to 5B are diagrams illustrating an organic EL element of an example of the invention.
Figure 5B:
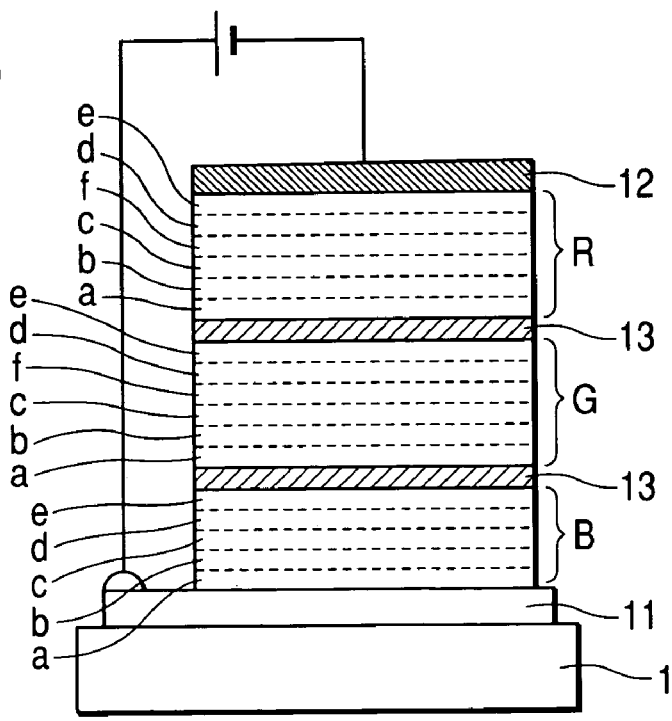
Figure 6:
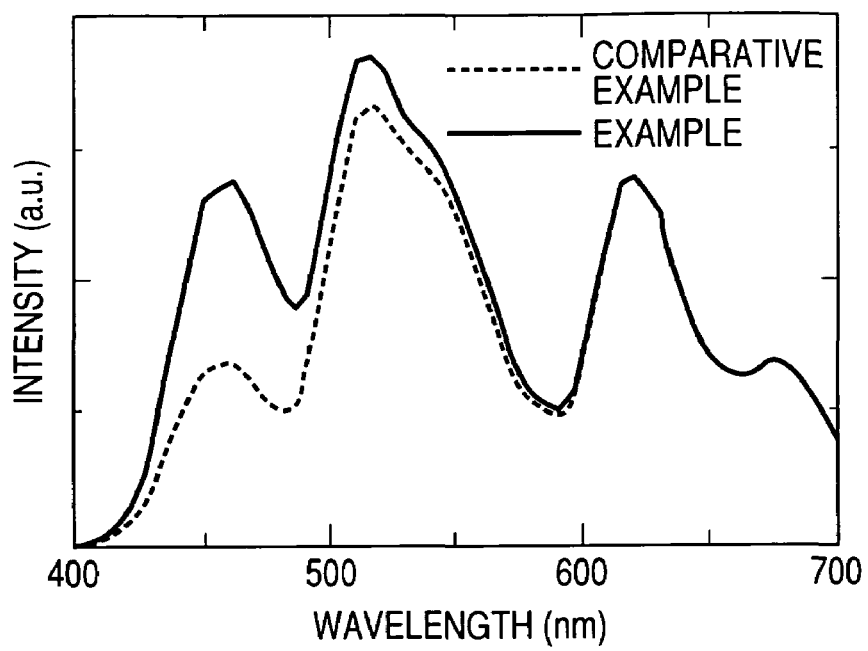
FIG. 6 is a diagram (luminescence spectrum graph) illustrating evaluation of the organic EL-element of the example of the invention.
Figure 7:
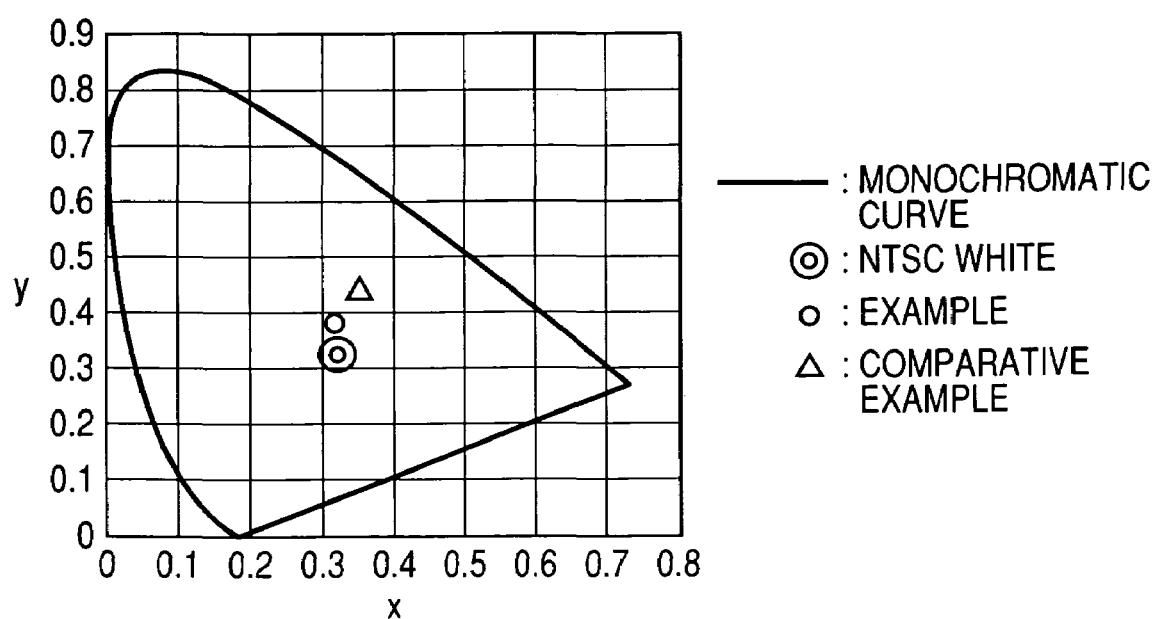
FIG. 7 is a diagram (chromaticity diagram) illustrating evaluation of the organic EL element of the example of the invention.

Hereinafter, an example of the invention will be described with reference to the accompanying drawings. FIG. 5A to 5B are diagrams showing the configurations of the example of the invention and a comparative example, and FIGS. 6 and 7 are luminescence characteristic diagrams showing evaluations of the example.

EXAMPLE

FIG. 5A shows an organic EL element of the example of the invention. In this example, in order to obtain white (the white region of the CIE xy chromaticity diagram (JIS Z 8110)) as the luminous color of the organic EL element, the selected colors of the light-emitting units are three colors of R (Red), G (Green), and B (Blue), a phosphorescent material is used in the light-emitting units of R (Red) and G (Green), and a fluorescent material is used in the light-emitting units of B (Blue). The basic configuration is identical with that of the embodiment described above (the identical components are denoted by the same reference numerals and duplicated description is omitted). In the example, however, two stages of light-emitting units configured by organic luminescent function layers $B_1$ and $B_2$ are disposed for blue, a single layer or an organic luminescent function layer G is disposed for green, and a single layer or an organic luminescent function layer R is disposed for red. Hereinafter, a more specific production method will be described.

First, as the lower wiring electrode 11 (the anode side), ITO is grown on the glass substrate 1 at a thickness of 150 nm by sputtering, and a photoresist (photoresist AZ6112 produced by Tokyo Ohka Kogyo Co., Ltd.) is patterned as a stripe on the ITO film. Namely, the substrate 1 is immersed in a mixture solution of an aqueous solution of ferric chloride and hydrochloric acid, to etch away ITO which is not covered by the photoresist. Thereafter, the substrate is immersed in acetone to remove the photoresist, thereby forming the substrate 1 on which a predetermined ITO pattern is formed.

Thereafter, the substrate 1 having the ITO pattern is loaded into a vacuum deposition apparatus, and layers are sequentially stacked in the following manner. CuPc of a thickness of 30 nm is grown as a hole transporting layer a, α-NPD of a thickness of 50 nm is grown as a hole injecting layer b, spiro-DPVBi of a thickness of 30 nm is grown as a luminescent layer c, $Alq_3$ of a thickness of 20 nm is grown as an electron transporting layer d, and $Li_2O$ of a thickness of 1 nm is grown as an electron injecting layer e, thereby forming the first blue organic luminescent function layer $B_1$.

On the first blue organic luminescent function layer $B_1$, $V_2O_5$ is grown as the conductive layer 13 at a thickness of 30 nm by vacuum deposition. In the same manner as the first blue organic luminescent function layer $B_1$, thereafter the second blue organic luminescent function layer $B_2$ is stacked on the conductive layer 13. Then, $V_2O_5$ is grown as the conductive layer 13 at a thickness of 30 nm by vacuum deposition on the second blue organic luminescent function layer $B_2$.

Thereafter, layers are sequentially stacked in the following manner. CuPc of a thickness of 20 nm is grown as a hole transporting layer a, α-NPD of a thickness of 20 nm is grown as a hole injecting layer b, a host material: CBP and a dopant: Ir(ppy)$_3$ are grown at a thickness of 30 nm as a luminescent layer c, BCP of a thickness of 10 nm is grown as a hole blocking layer f, Alq$_3$ of a thickness of 40 nm is grown as an electron transporting layer d, and Li$_2$O of a thickness of 1 nm is grown as an electron injecting layer e, thereby forming the green organic luminescent function layer G.

On the green organic luminescent function layer G, $V_2O_5$ is grown as the conductive layer 13 at a thickness of 30 nm by vacuum deposition.

Next, layers are sequentially stacked in the following manner. CuPc of a thickness of 20 nm is grown as a hole transporting layer a, α-NPD of a thickness of 60 nm is grown as a hole injecting layer b, a host material: CBP and a dopant: Btp$_2$Ir(acac) are grown at a thickness of 30 nm as a luminescent layer c, BCP of a thickness of 10 nm is grown as a hole blocking layer f, Alq$_3$ of a thickness of 20 nm is grown as an electron transporting layer d, and Li$_2$O of a thickness of 1 nm is grown as an electron injecting layer e, thereby forming the red organic luminescent function layer R.

As the upper wiring electrode 12 (the cathode side), then, Al is grown on the red organic luminescent function layer R at a thickness of 100 nm.

In an atmosphere of $N_2$, thereafter, a sealing substrate (not shown) made of glass is bonded by an adhesive agent such as a photo-curing resin to seal the thus configured organic EL element, thereby producing an organic EL panel. In the sealing substrate, a sealing depression is formed by a process such as press molding, etching, or blasting, and a desiccant such as BaO is bonded to the sealing depression.

COMPARATIVE EXAMPLE

An organic EL panel was produced in the same structure and production method as the example, except that the blue organic luminescent function layer of the organic EL panel of the above-described example was configured by a single layer.

Evaluation of Example

FIG. 6 shows luminescence spectra of the organic EL panels of the example and the comparative example, and FIG. 7 shows mixed colors which were obtained from the light-emitting surfaces of the organic EL elements, on a chromaticity diagram. In FIG. 6, the spectrum of the example in which the blue organic luminescent function layer is configured by the two layers ($B_1$, $B_2$), and two stages of blue light-emitting units are formed is indicated by the solid line, and that of the comparative example in which the blue organic luminescent function layer is configured by one layer is indicated by the broken line. In the luminescence spectrum (intensity: a.u.) of the example, the peak in the blue wavelength range of 420 to 480 nm is twice the value of the comparative example. In the green wavelength range of 500 to 560 nm, and the red wavelength range of 610 to 700 nm, the peaks in the example are equal to those of the comparative example. In the chromaticity comparison of FIG. 7, the chromaticity (Δ)(0.347, 0.433) of the comparative example is separated from NTSC white (◎) (0.310, 0.316), and the chromaticity (○) (0.307, 0.371) of the example of the invention has a value which is close to that of NTSC white.

What is claimed is:

1. An organic EL element comprising:
   a first wiring electrode;
   a second wiring electrode;
   a plurality of light-emitting units which exhibit organic EL luminescence and at least two different luminous colors, each of the plurality of light-emitting units being connected in series between the first wiring electrode and the second wiring electrode; and
   a light-emitting surface formed by overlapping partly or wholly light-emitting surfaces of the light-emitting units,
   wherein the plurality of light-emitting units comprise light-emitting units which exhibit one color and are formed in multiple stages, and a desired mixed color is obtained from the light-emitting surface by combining the different luminous colors,
   wherein each of the plurality of light-emitting units comprises at least one conductive layer and an organic luminescent function layer being connected to the conductive layer.

2. The organic EL element according to claim 1, wherein the plurality of light-emitting units comprise fluorescent light-emitting units and at least one phosphorescent light-emitting unit, wherein the fluorescent light-emitting units are formed in multiple stages with respect to the phosphorescent light-emitting unit.

3. The organic EL element according to claim 1, wherein the desired mixed color is white.

4. The organic EL element of claim 1, wherein a same current flows through each of the plurality of light-emitting units.

5. The organic EL element of claim 1, wherein the first wiring electrode is a cathode and the second wiring electrode is an anode.

6. A method of forming an organic EL element including a plurality of light-emitting units exhibiting organic EL luminescence and at least two different luminous colors, comprising:
   connecting the plurality of light-emitting units in series; and
   overlapping partly or wholly light-emitting surfaces of the light-emitting units to form a light-emitting surface of the organic EL element,
   wherein the plurality of light-emitting units comprise light-emitting units which exhibit one color and are formed in multiple stages,
   wherein a desired mixed color is obtained from the light-emitting surface of the organic EL element by combining the different luminous colors,
   wherein a lower wiring electrode that serves as an anode is grown on a substrate,
   wherein an upper wiring electrode that serves as a cathode is grown on the upper light-emitting unit.

7. The method according to claim 6, wherein the number of multiple stages is obtained based on a current-luminance efficiency of each of the light-emitting units exhibiting different luminous colors and a required luminance mixing ratio for obtaining the desired mixed color from the different colors.

8. The method according to claim 6, wherein the plurality of light-emitting units include fluorescent light-emitting units and at least one phosphorescent light-emitting unit, wherein the fluorescent light-emitting units are formed in multiple stages with respect to the phosphorescent light-emitting unit.

9. The method according to claims 6, wherein the desired mixed color is white.

10. The method according to claims 6, wherein a sealing substrate is bonded by an adhesive agent to seal the thus configured organic EL element.

11. An organic EL element comprising:

a first wiring electrode;

a second wiring electrode;

a plurality of light-emitting units which are connected in series, exhibit organic EL luminescence and at least two different color and include a first light-emitting unit exhibiting a first luminous color and a second light-emitting unit exhibiting a second luminous color; and a light-emitting surface formed by overlapping partly or wholly light-emitting surfaces of the light-emitting units, wherein a plurality of first light-emitting units are formed in multiple stages and a desired mixed color is obtained from the light-emitting surface by combining the first and second luminous colors;

wherein each of the plurality of light-emitting units comprises a pair of conductive layers and an organic luminescent function layer being interposed between the conductive layers, and wherein a same current flows through each of the light-emitting units.

12. The organic EL element of claim 11, wherein the first wiring electrode is a cathode and the second wiring electrode is an anode.

* * * * *